United States Patent [19]
Greenberg

[11] Patent Number: 5,519,655
[45] Date of Patent: May 21, 1996

[54] MEMORY ARCHITECTURE USING NEW POWER SAVING ROW DECODE IMPLEMENTATION

[75] Inventor: Craig B. Greenberg, Rowlette, Tex.

[73] Assignee: Texas Instruments Incorporated, Dallas, Tex.

[21] Appl. No.: 315,037

[22] Filed: Sep. 29, 1994

[51] Int. Cl.[6] .................................... G11C 7/00
[52] U.S. Cl. .................. 365/189.02; 365/230.03; 365/230.04; 365/230.05; 365/63
[58] Field of Search ................ 365/230.04, 230.05, 365/230.03, 154, 230.02, 230.06, 230.08, 63, 189.02

[56] References Cited

U.S. PATENT DOCUMENTS

| | | | |
|---|---|---|---|
| 5,089,992 | 2/1992 | Shinohara | 365/230.04 |
| 5,197,035 | 3/1993 | Ito | 365/230.05 |
| 5,276,650 | 1/1994 | Kubota | 365/230.05 |
| 5,291,443 | 3/1994 | Lim | 365/230.04 |

Primary Examiner—David C. Nelms
Assistant Examiner—Vu A. Le
Attorney, Agent, or Firm—Ronald O. Neerings; James C. Kesterson; Richard L. Donaldson

[57] ABSTRACT

The invention disclosed herein comprises a memory architecture using a new power saving ROW decode implementation. The new power saving ROW decode implementation uses a built in column mux of two. Two ROW drivers are provided for each ROW address. Each row signal from an individual ROW driver connects to every other memory cell (10). An individual ROW driver is selected based on the select signals used in the column mux. Being that the ROW drivers are muxed along with the columns, only memory cells of interest are selected. All unselected memory cell bit lines remain precharged from the previous precharge cycle thus reducing precharge power consumption as compared with previous memory architectures.

21 Claims, 5 Drawing Sheets

MEMORY ARCHITECTURE USING NEW POWER SAVING ROW DECODE IMPLEMENTATION

FIELD OF THE INVENTION

The present invention relates to the field of integrated circuit memory architecture. More specifically, the present invention relates to memory architecture using a new power saving ROW decode implementation.

BACKGROUND OF THE INVENTION

FIG. 1 illustrates a typical memory architecture for a single port random access memory (RAM). As shown, the architecture typically includes a "built in" column mux. One advantage of using column muxing is that each physical row of memory is equivalent to, in this case, two words rather than one word. This allows for deeper memories, i.e. total number of words, for a given physical dimension. By increasing or decreasing the muxing, the memory's aspect ratio can be altered to the user's advantage. Typically, this built in column mux is two, but may be higher depending on the memory. Another advantage is the sense amplifier's layout requirement. In the mux two case, the layout requirement has a pitch of two rather than one.

Unfortunately, a major disadvantage of the built in column mux is power consumption. Any time a row is selected, either read or write, one bit line from each memory cell accessed by that row will eventually discharge to ground. This occurs on all the memory cells accessed by the row, even the cells that are not of interest, i.e., the cells not being addressed by the column mux address. The bit lines, associated with the cells, that are discharged to ground require precharging "rail to rail" for the next clock cycle. As a result, in a column mux of two, power is wasted in that half the memory cells that are discharged are not of pending interest. Precharge power consumption is a significant percentage of overall power consumption.

FIG. 2 illustrates a typical memory architecture for a dual port memory. As in the single port memory shown in FIG. 1, the dual port memory suffers from the dissipation problem due to unselected columns being discharged. In addition, the dual port memory has a problem that exists during simultaneous row addressing. Any time either port selects a row address, the unselected column address with their associated unselected memory cells, discharge all unselected bit lines to ground. If the other port now selects one of these unselected memory cells to perform a write operation, the write speed will be degraded significantly since it must charge up the previously discharged bit line through a "weak" pass transistor of the opposite port in order to write to the cell, as shown in FIG. 3. A typical solution to this problem is to not disable the precharge circuitry on unselected columns. Unfortunately, the penalty is large power consumption.

SUMMARY OF THE INVENTION

The invention disclosed herein comprises a memory architecture using a new power saving ROW decode implementation. The new power saving ROW decode implementation uses a built in column mux of two. Two ROW drivers are provided for each ROW address. Each ROW signal from an individual ROW driver connects to every other memory cell. An individual ROW driver is selected based on the select signals used in the column mux. Being that the ROW drivers are muxed along with the columns, only memory cells of interest are selected. All unselected memory cell bit lines remain precharged from the previous precharge cycle thus reducing precharge power consumption as compared with previous memory architectures.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF PREFERRED EMBODIMENTS

Figure 1:
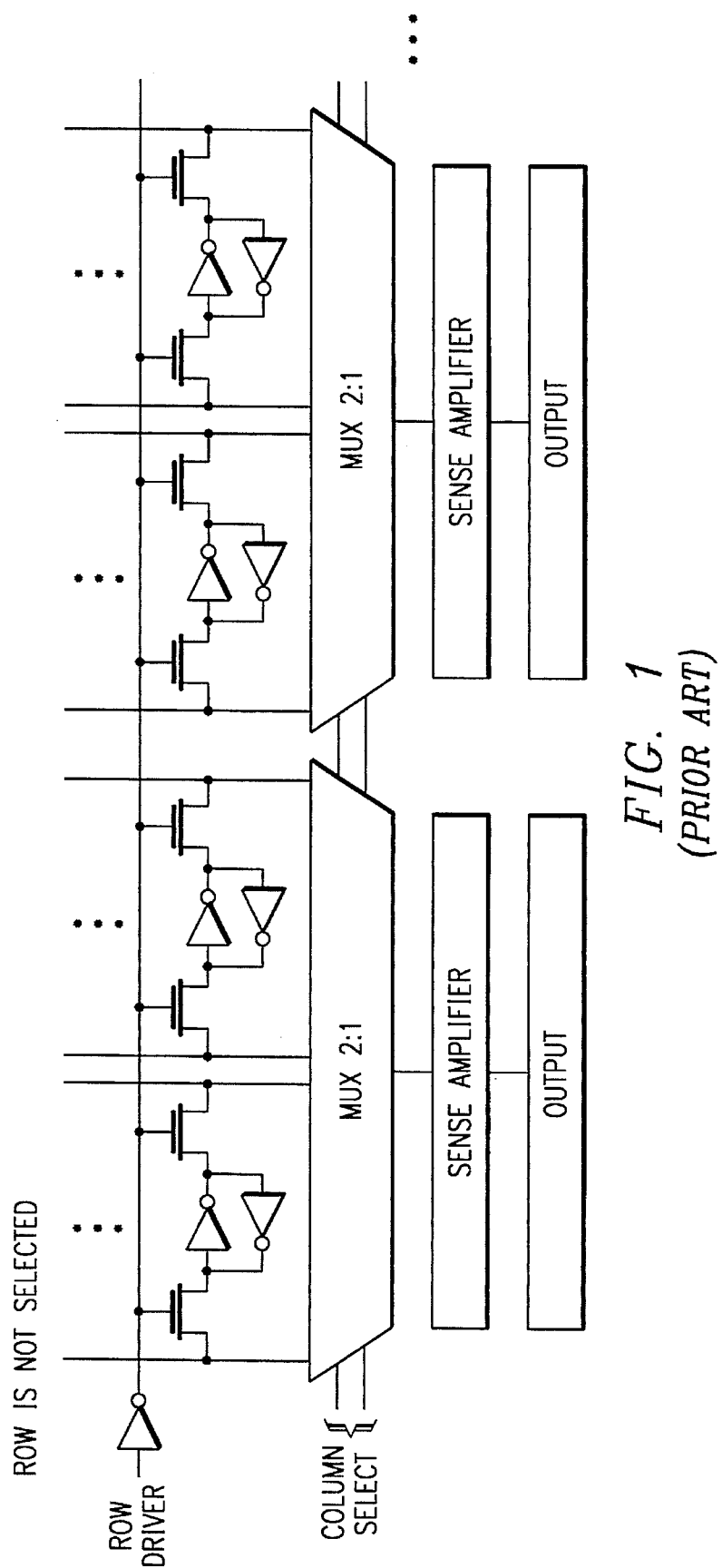
FIG. 1 is a schematic diagram of a typical memory architecture for a single port RAM.
Figure 2:
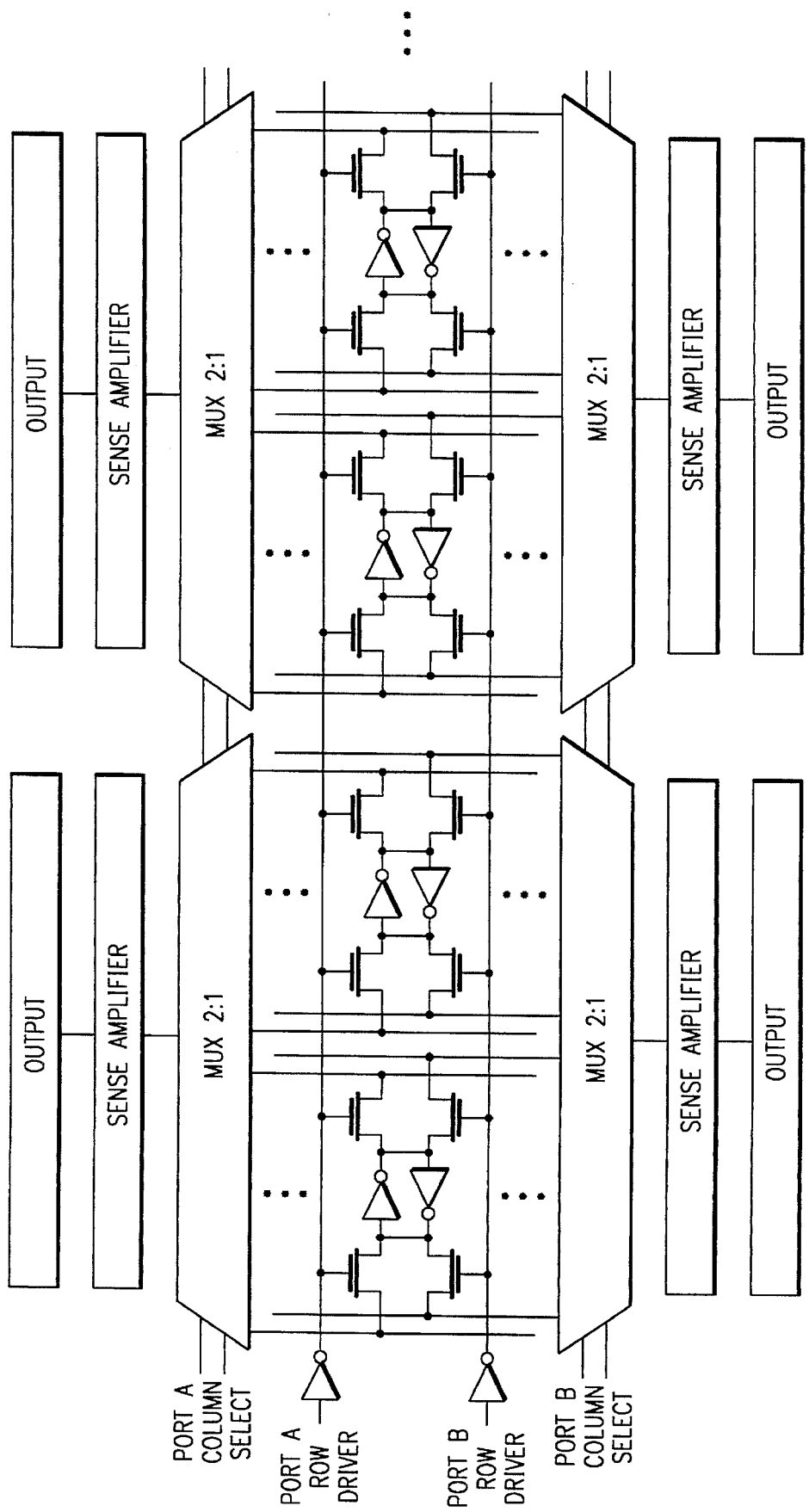
FIG. 2 is a schematic diagram of a typical memory architecture for a dual port RAM.
Figure 3:
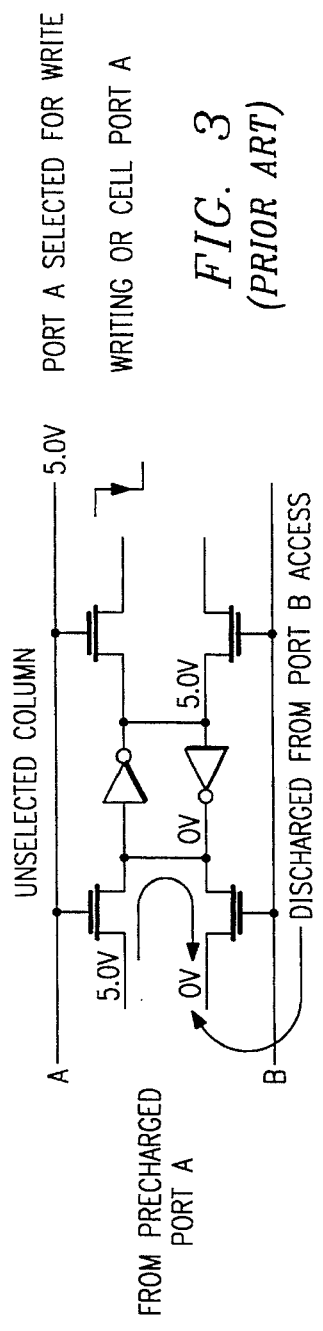
FIG. 3 is a schematic diagram of a memory cell of the dual port RAM shown in FIG. 2.
Figure 4:
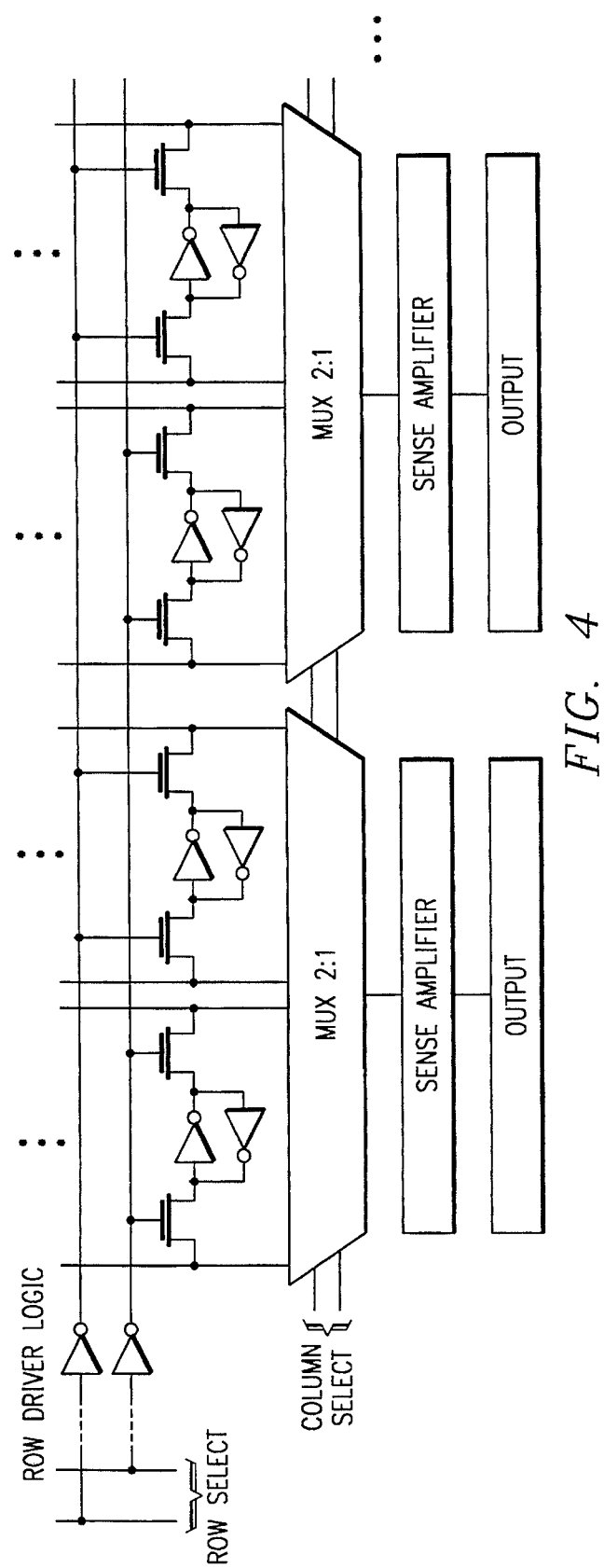
FIG. 4 is a schematic diagram of a single port memory architecture using a new power saving ROW decode implementation, according to one embodiment of the invention.

FIG. 4 is a schematic diagram of a single port memory architecture using a new power saving ROW decode implementation. The memory architecture of FIG. 4 utilizes a built in column mux of two. Each row address addresses two row drivers. An individual row driver is selected based on the select signal used in the column mux. Each row signal from an individual row driver connects to every other memory cell 10. Being that the row drivers are muxed along with the columns, only memory cells of interest are selected. All unselected memory cell bit lines remain precharged from the previous precharge cycle. As a result, the power required for precharge is effectively reduced to half as compared to the memory architecture of FIG. 1.

A column mux of two requires the running of two row lines per memory cell. The extra area required for the running of the second row line should be small since the size of the cell is usually determined by the transistor sizes. If the memory is implemented using gate array technology, where the base cell is relatively large, the only penalty is one more routing track for the extra row line.

Figure 5:
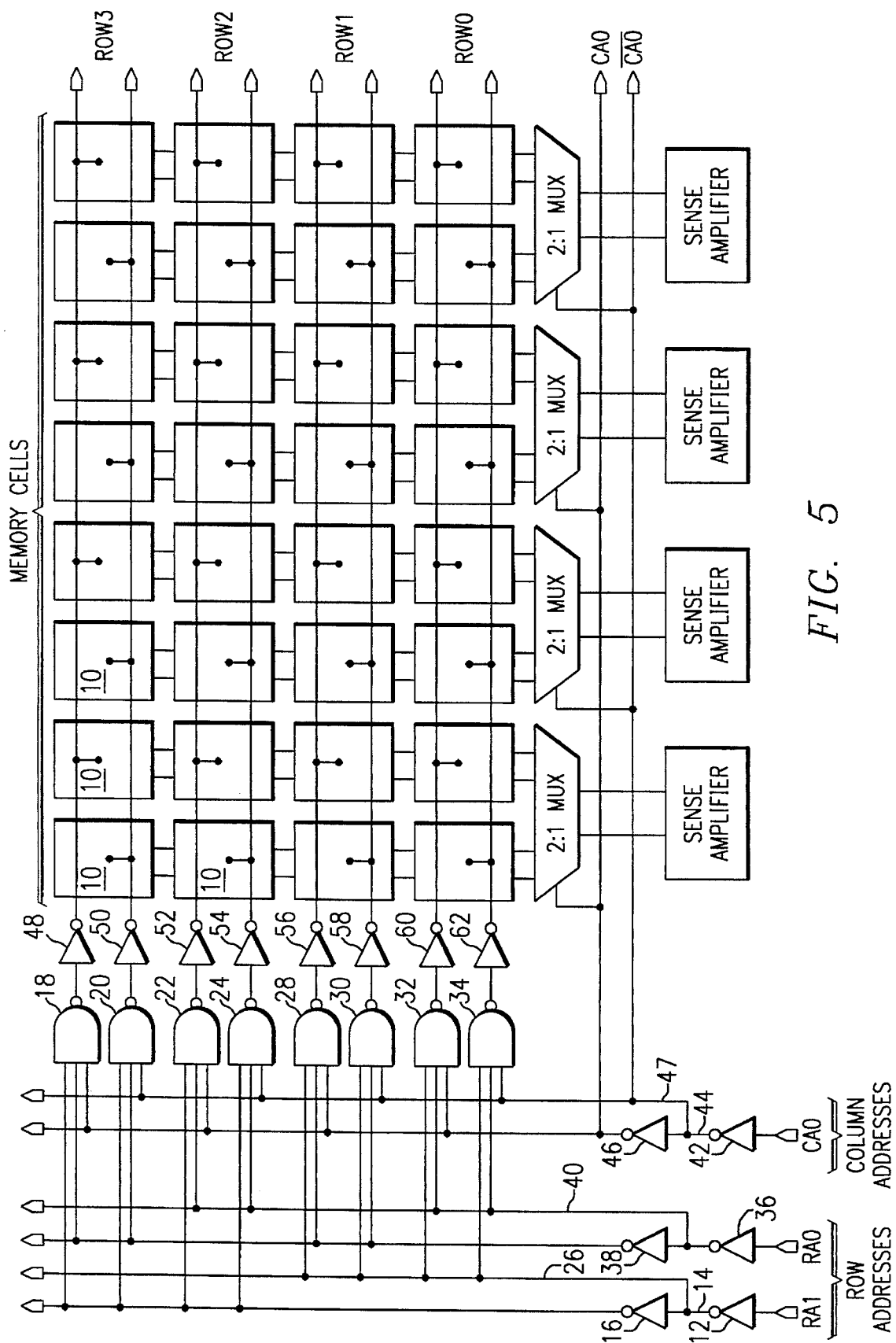
FIG. 5 is a schematic diagram of a single port memory architecture using the power saving ROW decode implementation shown in FIG. 4.

FIG. 5 is a schematic diagram of a single port memory architecture using the power saving ROW decode implementation shown in FIG. 4. FIG. 5 includes the column address logic and the row decoding logic required to interconnect the row addresses to the row driver logic. Inverter 12 couples signal line RA1 to signal line 14. Inverter 16 couples signal line 14 to first inputs of NAND gates 18, 20, 22 and 24. A signal line 26 couples signal line 14 to first inputs of NAND gates 28, 30, 32 and 34. Inverter 36 couples signal line RA0 to signal line 37. Inverter 38 couples signal line 36 to second inputs of NAND gates 18, 20, 28 and 30. A signal line 40 couples signal line 37 to second inputs of NAND gates 22, 24, 32 and 34. Inverter 42 couples signal line CA0 to signal line 44. Inverter 46 couples signal line 44 to third inputs of NAND gates 18, 22, 28, 32 and to a first group of every other column MUX 2:1. A signal line 47 couples signal line 44 to third inputs of NAND gates 20, 24, 30, 34 and to a second group of every other column MUX 2:1.

Inverter 48 couples the output of NAND gate 18 to a first group of every other memory cell 10 in ROW 3. Inverter 50 couples the output of NAND gate 20 to a second group of every other memory cell in ROW 3. Inverter 52 couples the output of NAND gate 22 to a first group of every other memory cell in ROW 2. Inverter 54 couples the output of NAND gate 24 to a second group of every other memory cell in ROW 2. Inverter 56 couples the output of NAND gate 28 to a first group of every other memory cell in ROW 1. Inverter 58 couples the output of NAND gate 28 to a second group of every other memory cell in ROW 1. Inverter 60 couples the output of NAND gate 30 to a first group of every other memory cell in ROW 0. Inverter 62 couples the output of NAND gate 30 to a second group of every other memory cell in ROW 0. A specific memory cell is selected by placing logic signals on row address signal lines RA1, RA0 and on column address signal line CA0. For example, if a logic low is placed on row addresses RA1, RA0 and column address CA0, the decoding logic and mux combination will select one memory cell in row 0.

Figure 6:
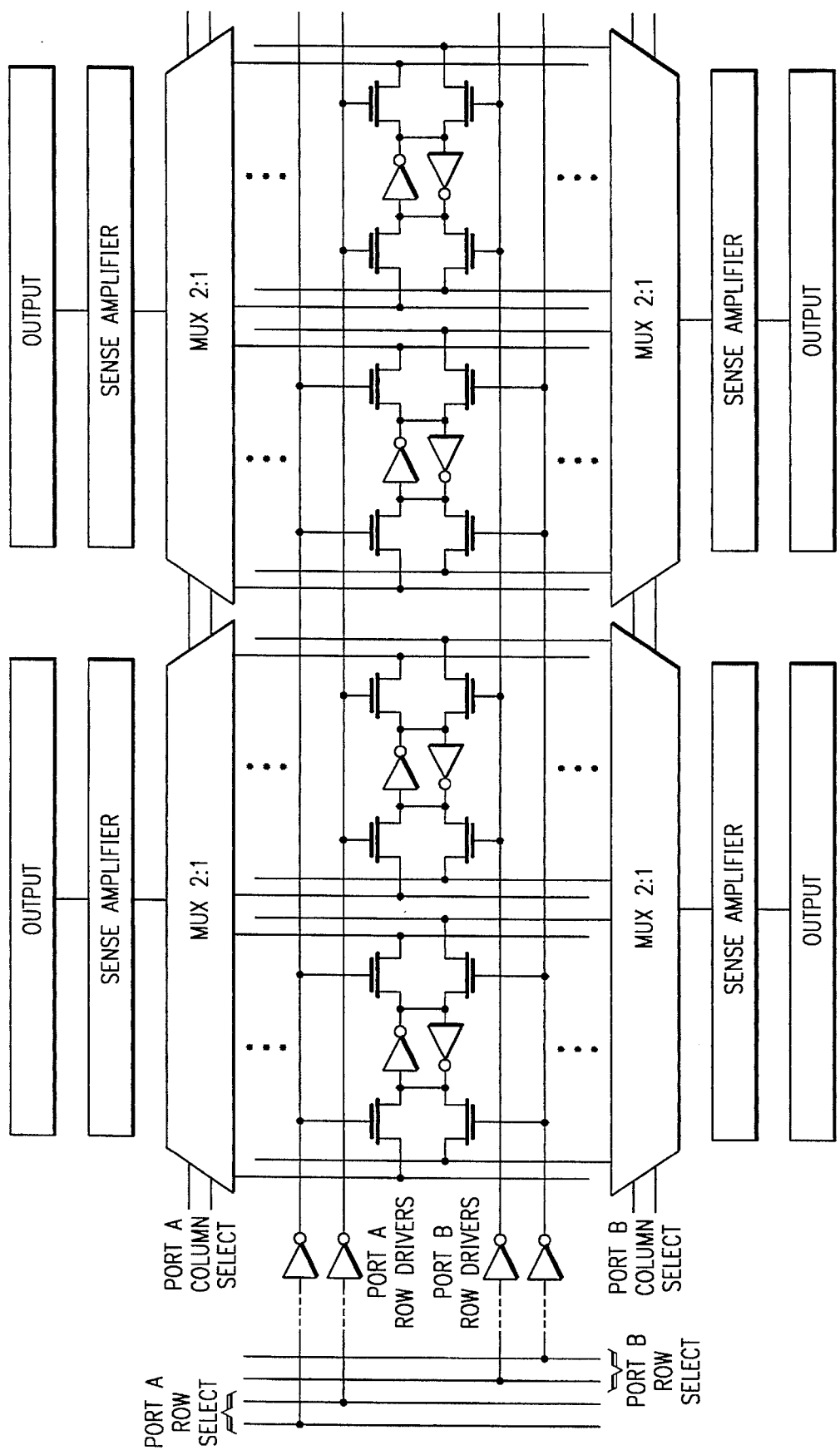
FIG. 6 is a schematic diagram of a dual port memory architecture using a new power saving ROW decode implementation, according to another embodiment of the invention.

The row decoding implementation can be applied to other memory configurations and/or larger column muxing. FIG. 6 illustrates a dual port memory incorporating the new row decoding implementation. As before, the row drivers are decoded along with the columns. All unselected columns are not discharged since their corresponding row is not selected. Therefore, the write recovery problem due to simultaneous row access from both ports is not an issue. The row decoding implementation can also be applied to all level memories, but the penalty is in area. An all level memory implementation requires addition lead pitch through the memory cell thus decreasing bit density.

While this invention has been described with reference to an illustrative embodiment, this description is not to be construed in a limiting sense. For example, while the memory architecture using a new power saving ROW decode implementation has been described in combination with single and dual port memories, additional rows can be added provided the base cell can accommodate extra tracks. And while a column mux of two has been disclosed, the idea can be extended to any column mux. Various modifications to the illustrative embodiments, as well as other embodiments of the invention will be apparent to persons skilled in the art upon reference to this description. It is therefore contemplated that the appended claims will cover any such modifications or embodiments as fall within the true scope of the invention.

What is claimed:

1. A device, comprising:
   rows and columns of memory cells;
   column multiplex circuits each coupling two columns of memory cells to a respective sense amplifier;
   two ROW drivers provided for each ROW address; and
   a first ROW signal line coupling one of said two ROW drivers to a first group of every other memory cell in a respective row of memory cells and a second ROW signal line coupling the other of said two ROW drivers to a second group of every other memory cell in said respective row of memory cells.

2. The device of claim 1 in which said device is a single port random access memory (RAM).

3. The device of claim 1 in which said column multiplex circuits have a ratio of 2:1.

4. The device of claim 1 in which each ROW address addresses two ROW drivers.

5. The device of claim 4 in which an individual ROW driver is selected based on the select signals used in the column multiplex circuits.

6. A device, comprising:
   rows and columns of memory cells;
   column multiplex circuits each coupling two columns of memory cells to a respective sense amplifier;
   two ROW drivers provided for each ROW address:
   a first ROW signal line coupling one of said two ROW drivers to a first group of every other memory cell in a respective row of memory cells and a second ROW signal line coupling the other of said two ROW drivers to a second group of every, other memory cell in said respective row of memory cells; and
   decoding logic for coupling ROW and column address lines to said ROW drivers.

7. The device of claim 6 in which said decoding logic comprises a NAND gate having a first input connected to one ROW select signal line, a second input connected to another ROW select signal line and a third input connected to a column select signal line.

8. A device, comprising:
   rows and columns of dual port memory cells;
   a first column multiplex circuit coupled to memory cells in a column of said dual port memory cells, each memory cell being connected to one of said dual ports;
   a second column multiplex circuit coupled to memory cells in said column of dual port memory cells, each memory cell being connected to the other of said dual ports; four ROW drivers provided for each ROW address; and
   a first ROW signal line coupling one of said four ROW drivers to a first group of every other memory cells in a respective row of memory cells, a second ROW signal line coupling a second of said four ROW drivers to a second group of every other memory cells in said respective row of memory cells, a third ROW signal line coupling a third of said four ROW drivers to said first group of every other memory cells in said respective row of memory cells and a fourth ROW signal line coupling a fourth of said four ROW drivers to said second group of every other memory cells in said respective row of memory cells.

9. The device of claim 8 in which said device is a dual port random access memory (RAM).

10. The device of claim 8 in which said column multiplex circuits have a ratio of 2:1.

11. The device of claim 8 in which each ROW address of each port addresses two ROW drivers.

12. The device of claim 11 in which an individual ROW driver of a port is selected based on the select signals used in the column mux of said port.

13. A device, comprising:
    rows and columns of dual port memory cells;
    a first column multiplex circuit coupled to memory cells in a column of said dual port memory cells, each memory cell being connected to one of said dual ports;
    a second column multiplex circuit coupled to memory cells in said column of dual port memory cells, each memory, cell being connected to the other of said dual ports;

four ROW drivers provided for each ROW address;

a first ROW signal line coupling one of said four ROW drivers to a first group of every, other memory cells in a respective row of memory cells, a second ROW signal line ROW drivers to said first group of every other memory cells in said respective row of coupling a second of said four ROW drivers to a second in said respective row of memory cells, a third ROW signal line coupling a third of said four memory cells and a fourth ROW signal line coupling a fourth of said four ROW drivers to said second group of every other memory cells in said respective row of memory cells; and decoding logic for coupling ROW and column address lines to said ROW drivers.

14. The device of claim 8 further including sense amplifiers coupled to said first and second column multiplex circuits.

15. A device, comprising:

rows and columns of memory cells;

column multiplex circuits each coupling at least two columns of memory cells to a respective sense amplifier;

at least two ROW drivers provided for each ROW address; and a first ROW signal line coupling one of said ROW drivers to a first group of memory cells in a respective row of memory cells and a second ROW signal line coupling another one of said ROW drivers to a second group of memory cells in said respective row of memory cells.

16. The device of claim 15 in which said device is a single port random access memory (RAM).

17. The device of claim 15 in which an individual ROW driver is selected based on the select signals used in the column multiplex circuits.

18. A device, comprising:

rows and columns of memory cells;

column multiplex circuits each coupling at least two columns of memory cells to..a respective sense amplifier;

at least two ROW drivers provided for each ROW address;

a first ROW signal line coupling one of said ROW drivers to a first group of memory cells in a respective row of memory cells and a second ROW signal line coupling another one of said ROW drivers to a second group of memory cells in said respective row of memory cells; and decoding logic for coupling ROW and column address lines to said ROW drivers.

19. The device of claim 1 in which each memory cell has a common I/O.

20. The device of claim 8 in which each memory cell has a common I/O.

21. The device of claim 15 in which each memory cell has a common I/O.

* * * * *